(12) United States Patent
Torres et al.

(10) Patent No.: US 10,529,660 B2
(45) Date of Patent: Jan. 7, 2020

(54) PORE-FILLED DIELECTRIC MATERIALS FOR SEMICONDUCTOR STRUCTURE FABRICATION AND THEIR METHODS OF FABRICATION

(71) Applicant: Intel Corporation, Santa Clara, CA (US)

(72) Inventors: Jessica M. Torres, Portland, OR (US); Jeffery D. Bielefeld, Forest Grove, OR (US); Mauro J. Kobrinsky, Portland, OR (US); Christopher J. Jezewski, Portland, OR (US); Gopinath Bhimarasetti, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/318,643

(22) PCT Filed: Sep. 30, 2016

(86) PCT No.: PCT/US2016/054844
§ 371 (c)(1),
(2) Date: Jan. 17, 2019

(87) PCT Pub. No.: WO2018/063344
PCT Pub. Date: Apr. 5, 2018

(65) Prior Publication Data
US 2019/0252313 A1    Aug. 15, 2019

(51) Int. Cl.
*H01L 23/522*    (2006.01)
*H01L 23/532*    (2006.01)
(Continued)

(52) U.S. Cl.
CPC .... *H01L 23/5226* (2013.01); *H01L 21/02126* (2013.01); *H01L 21/02203* (2013.01);
(Continued)

(58) Field of Classification Search
None
See application file for complete search history.

(56) References Cited

U.S. PATENT DOCUMENTS

| 2004/0018717 A1 | 1/2004 | Fornof et al. |
| 2010/0041202 A1 | 2/2010 | Abadeer et al. |

(Continued)

OTHER PUBLICATIONS

International Search Report and Written Opinion for International Patent Application No. PCT/US2016/054844 dated Jun. 27, 2017, 9 pgs.

(Continued)

*Primary Examiner* — Jack S Chen
(74) *Attorney, Agent, or Firm* — Schwabe, Williamson & Wyatt, P.C.

(57) ABSTRACT

Pore-filled dielectric materials for semiconductor structure fabrication, and methods of fabricating pore-filled dielectric materials for semiconductor structure fabrication, are described. In an example, a method of fabricating a pore-filled dielectric material for semiconductor structure fabrication includes forming a trench in a material layer. The method also includes filling the trench with a porous dielectric material using a spin-on deposition process. The method also includes filling pores of the porous dielectric material with a metal-containing material using an atomic layer deposition (ALD) process.

5 Claims, 14 Drawing Sheets

(51) Int. Cl.
  *H01L 21/768* (2006.01)
  *H01L 21/02* (2006.01)
  *H01L 21/033* (2006.01)
  *H01L 21/311* (2006.01)

(52) U.S. Cl.
  CPC .. *H01L 21/02216* (2013.01); *H01L 21/02282* (2013.01); *H01L 21/0332* (2013.01); *H01L 21/0337* (2013.01); *H01L 21/31144* (2013.01); *H01L 21/76808* (2013.01); *H01L 21/76811* (2013.01); *H01L 21/76816* (2013.01); *H01L 23/5329* (2013.01)

(56) References Cited

U.S. PATENT DOCUMENTS

| | | | |
|---|---|---|---|
| 2014/0353802 A1 | 12/2014 | Licausi et al. | |
| 2015/0179578 A1 | 6/2015 | Jezewski et al. | |
| 2015/0270163 A1 | 9/2015 | Posseme | |
| 2019/0237366 A1* | 8/2019 | Yang | H01L 21/76807 |
| 2019/0252313 A1* | 8/2019 | Torres | H01L 21/02126 |

OTHER PUBLICATIONS

International Preliminary Report on Patentability for International Patent Application No. PCT/US2016/054844 dated Apr. 11, 2019, 8 pgs.

\* cited by examiner

PORE-FILLED DIELECTRIC MATERIALS FOR SEMICONDUCTOR STRUCTURE FABRICATION AND THEIR METHODS OF FABRICATION

CROSS-REFERENCE TO RELATED APPLICATION

This patent application is a U.S. National Phase Application under 35 U.S.C. § 371 of International Application No. PCT/US2016/054844, filed Sep. 30, 2016, entitled "PORE-FILLED DIELECTRIC MATERIALS FOR SEMICONDUCTOR STRUCTURE FABRICATION AND THEIR METHODS OF FABRICATION," which designates the United States of America, the entire disclosure of which is hereby incorporated by reference in its entirety and for all purposes.

TECHNICAL FIELD

Embodiments of the invention are in the field of semiconductor structures and processing and, in particular, pore-filled dielectric materials for semiconductor structure fabrication and methods of fabricating pore-filled dielectric materials for semiconductor structure fabrication.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

DESCRIPTION OF THE EMBODIMENTS

Figure 1A:
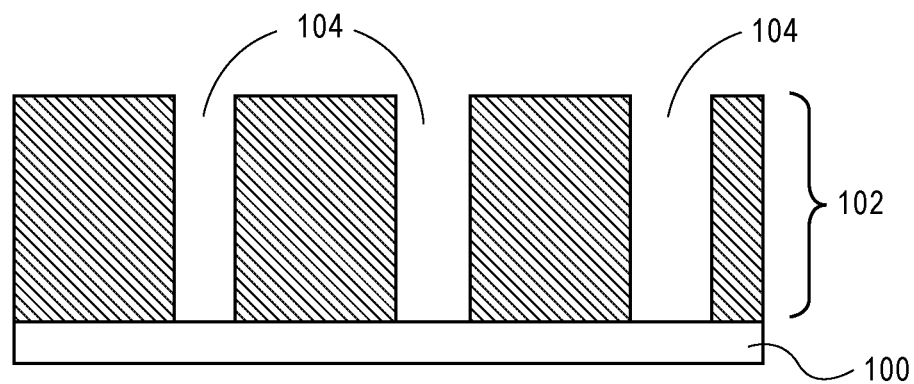
FIGS. 1A-1D illustrate cross-sectional views representing various operations in a method of fabricating a pore-filled dielectric material, in accordance with an embodiment of the present invention.

Pore-filled dielectric materials for semiconductor structure fabrication, and methods of fabricating pore-filled dielectric materials for semiconductor structure fabrication, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be appreciated that the various embodiments shown in the Figures are illustrative representations and are not necessarily drawn to scale.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL. Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments are directed to fabrication of a material layer, such as a hardmask layer, having dual etch properties or characteristics. Embodiments described herein may be implemented to enable patterning techniques for fabricating semiconductor devices or structures having a pitch or 20 nanometers (20 nm) or less. Embodiments described herein may be implemented enable the fabrication of etch resistant fill materials. One or more embodiments involve the filling of porous dielectric materials with a fill material. The fill material may be incorporated to an extent that changes the etch characteristics of a porous dielectric material to become more like the etch characteristics of the fill material. In an embodiment, a material fabrication process separates two aspects of forming a fillable etch stop material. In a first aspect, a spin-on porous low k material is used to achieve a good fill of a trench. In a second aspect, an atomic layer deposition (ALD) process is then used to fill pores in the spin-on porous low k material and ultimately define the etch selectivity of the resulting material.

To provide context, for many novel patterning techniques, a set of materials is needed with unique etch characteristics. Along with etch selectivity, such patterning flows may also require the materials to have the ability to uniformly fill features of various pitch and aspect ratios. Standard methods may be unable to meet this fill requirement. For example, chemical vapor deposition (CVD) based approaches tend to pinch off forming voids. On the other hand, ALD based approaches can fill features but leave a seam. Furthermore, spin-on techniques for non-porous films may have associated difficulties generating a fully crosslinked film in a narrow and/or high aspect ratio feature. The above approaches may also be hampered by associated non-uniform etch rates from a top of the structure to a bottom of the structure.

In an aspect, the fillablity of a spin-on inter-layer dielectric (ILD) technology is combines with the chemical stability of ALD technology. In an example, FIGS. 1A-1D illustrate cross-sectional views representing various operations in a method of fabricating a pore-filled dielectric material, in accordance with an embodiment of the present invention.

Referring to FIG. 1A, a method of fabricating a pore-filled dielectric material for semiconductor structure fabrication includes first forming a patterned material layer 102 above a substrate or underlying structure 100. The patterned material layer 102 includes a plurality of trenches 104 formed therein. In an embodiment, the patterned material layer 102 is a patterned hardmask layer. In an embodiment, the patterned material layer 102 is a patterned dielectric layer.

In an embodiment, the trenches 104 in the patterned material layer 102 are formed using a pitch division processing and patterning scheme. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch, e.g., to form a grating structure. Pitch division processing is then implemented as a technique to increase line density. An example of pitch halving is described in greater detail below in association with FIGS. 7A and 7B.

Figure 1B:
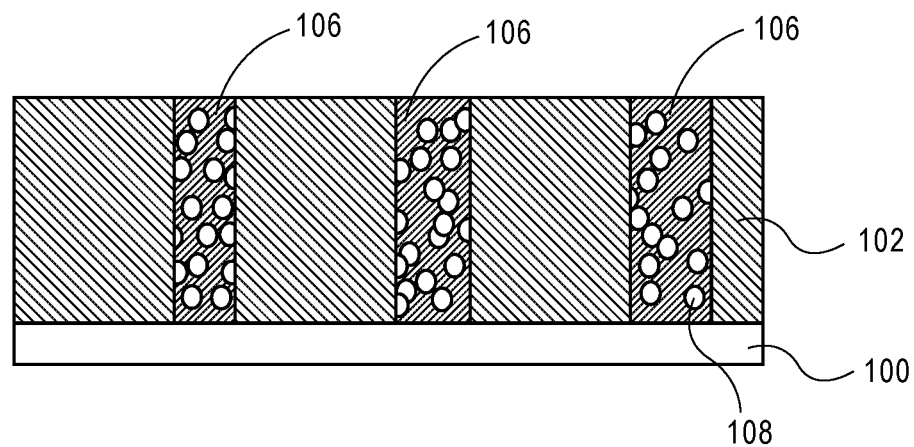

Referring to FIG. 1B, a porous dielectric material 106 is formed in the trenches 104 of the patterned material layer 102. The porous dielectric material 106 has a plurality of pores 108 formed therein. In one embodiment, the porous dielectric material 106 is a low-k porous dielectric material layer. In an embodiment, the porous dielectric material 106 is formed using a spin-on deposition process.

In an embodiment, the porous dielectric material 106 is a highly porous, e.g., 50%+, spin-on material that has been optimized to fill high aspect ratio features. In an embodiment, the porous dielectric material 106 has 30% or more pore density. In one such embodiment, the porous dielectric material 106 has a porosity approximately in the range of 40-60%, and preferably around 50%. In an embodiment, the pores are open cells pores in that they are interconnected and are not closed cell pores. In an embodiment, the porous dielectric material 106 can be loaded with different materials. In an embodiment, the porous dielectric material 106 can provide for uniform fill of up to 10:1 (height to width) aspect ratio features, e.g., trenches formed in a hardmask layer.

In an embodiment, the porous dielectric 106 is selected from a class of materials based on hydrosilane precursor molecules, where catalyst mediates reaction of Si—H bonds with cross-linkers such as water, tetraethoxyorthosilicate (TEOS), hexaethoxytrisilacyclohexane or similar multifunctional cross-linkers. In one such embodiment, the porous dielectric 106 is based on trisilacyclohexanes linked together by O groups. In other embodiments, alkoxy-silane based dielectric precursors or silsesquioxane (SSQ) are used to form the porous dielectric 106.

Although not limited to such material, in an embodiment, the porous dielectric 106 is a spin-on dielectric material based on a 1,3,5-trisilacyclohexane building block. Cross-linking with loss of solubility of such a material (or other silicon based dielectrics) can be initiated either thermally, or at lower temperatures, by use of acid, base or Lewis acid catalyst processes. In one embodiment, such low temperature catalysis is critical for the implementation of approaches described herein.

Figure 1C:
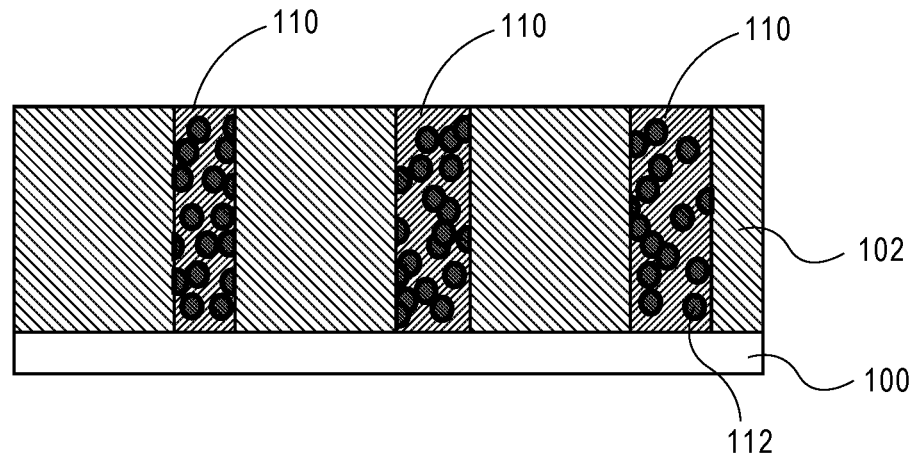
Figure 1D:
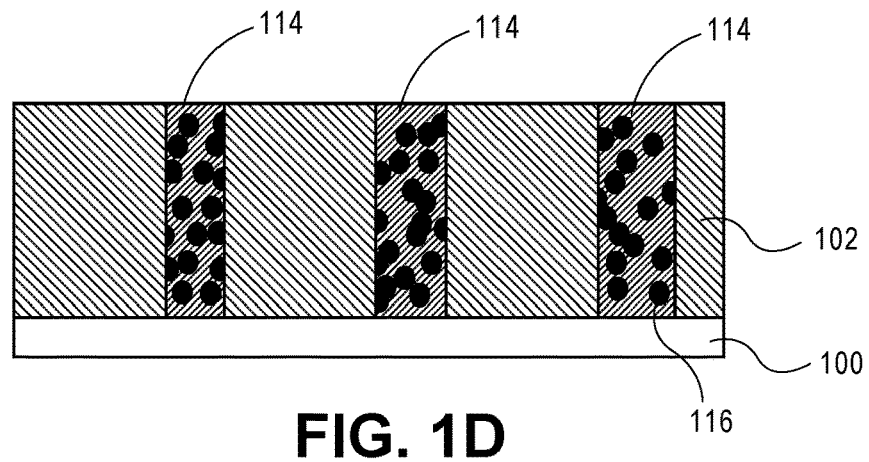

Referring to FIGS. 1C and 1D, the method further includes filling the pores 108 of the porous dielectric material 106. The process of filling the pores 108 may be relatively slow, starting with initial filling to form material 110 having partially filled pores 112 (as shown in FIG. 1C). In an embodiment, the process is continued until a pore-filled material 114 including completely or substantially completely filled pores 116 is formed (as shown in FIG. 1D).

In an embodiment, the pores 108 are filled using an atomic layer deposition (ALD) process. In one such embodiment, a slow and penetrating ALD process is used to fill the pores of the porous dielectric material 106. By using the above described two-operation process of spin-on trench fill followed by ALD pore filling, a uniform fill of the trench together with chemical stability of the resulting pore-filled material may be achieved. In an embodiment, no seams are formed in layer 106, in contrast to conventional ALD processing. In other embodiments, the pores 108 are filled using a second spin-on process.

In an embodiment, the pores 108 are filled with a metal-containing material. In one such embodiment, the metal-containing material is a metal nitride such as, but not limited to, titanium nitride (TiN) or tantalum nitride (TaN). In another such embodiment, the metal-containing material is a metal oxide such as, but not limited to, tantalum oxide ($Ta_2O_5$), titanium oxide ($TiO_2$), aluminum oxide ($Al_2O_3$), or hafnium oxide ($HfO_2$). In other embodiments, a non-metal-containing material, such as silicon nitride, silicon oxide, silicon dioxide or silicon carbide, is used to fill the pores 108. In a particular embodiment, the pore-filled material 114 represents a combination of a low-k dielectric (e.g., Si—O—C composition) and an ALD material such as a nitrides or oxide.

In an embodiment, the layer 102 that now includes pore-filled material 114 therein is referred to as a two-color structure because of the dual etch properties of the film, e.g., the etch properties of the hardmask or ILD 102 and the etch properties of the structures 114. That is, filling the pores of the porous dielectric material with the metal-containing material provides a hardmask layer having a dual etch selectivity. In an embodiment, the pore-filled material 114 of the two color system has a unique etch selectivity and good fill (e.g., no voids or seams). In one such embodiment, the process results in the ability to sequentially and uniformly fill features with a mixture of Si—C—O and ALD chemistry.

In an embodiment, the etch characteristics of the pore-filled material 114 provides for an etch rate dominated by the metal-containing material when exposed to an etchant including a fluorocarbon. For example, an exemplary nano-composite material of pore-filled material 114 is a TiN-filled porous SiOC having a significantly increased etch resistance to SiO etch chemistries, e.g., 3-4 times etch rate difference relative to the porous SiOC material on its own when using $CF_4$ as an etchant. In an embodiment, the formation of a pore-filled material 114 provides the ability to achieve etch selectivity tuning.

The structure of FIG. 1D may be used to ultimately pattern an underlying semiconductor layer. As an example, FIG. 2 illustrates a cross-sectional view representing an operation in a method of using a pore-filled dielectric material for semiconductor structure manufacture, in accordance with an embodiment of the present invention.

Figure 2:
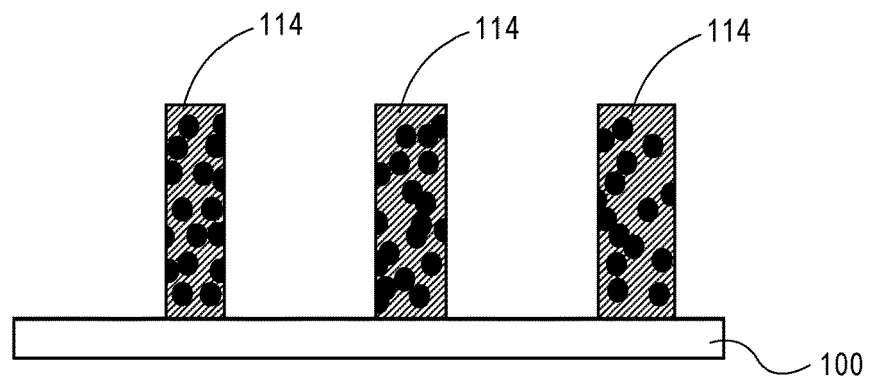
FIG. 2 illustrates a cross-sectional view representing an operation in a method of using a pore-filled dielectric material for semiconductor structure manufacture, in accordance with an embodiment of the present invention.

Referring to FIG. 2, the patterned material layer 102 is removed the selective to the pore-filled dielectric material 114. In an embodiment, the patterned material layer 102 is a patterned carbon-doped silicon oxide material and is removed using an etch process selective to the pore-filled dielectric material 114. The patterned formed by the remaining pore-filled dielectric material 114 may then be transferred to an underlying semiconductor layer (e.g., in this case, substrate 100 is a semiconductor substrate or is a substrate having a semiconductor layer thereon). Overall, the process may effectively be viewed as a negative-tone process.

As such, in an embodiment, the pore-filled dielectric material 114 is used as an etch mask for etching a semiconductor layer. In an embodiment, the pore-filled dielectric material 114 is used as an etch mask for etching a plurality of semiconductor fins in a semiconductor layer. In another embodiment, the pore-filled dielectric material 114 is used as an etch mask for etching a plurality of gate lines in a semiconductor layer. In either case, in an embodiment, the pore-filled dielectric material 114 is a sacrificial material in that it is ultimately removed.

FIGS. 3A-3D illustrate cross-sectional views representing various operations in a method of using a pore-filled dielectric material for semiconductor structure manufacture, in accordance with an embodiment of the present invention.

Figure 3A:
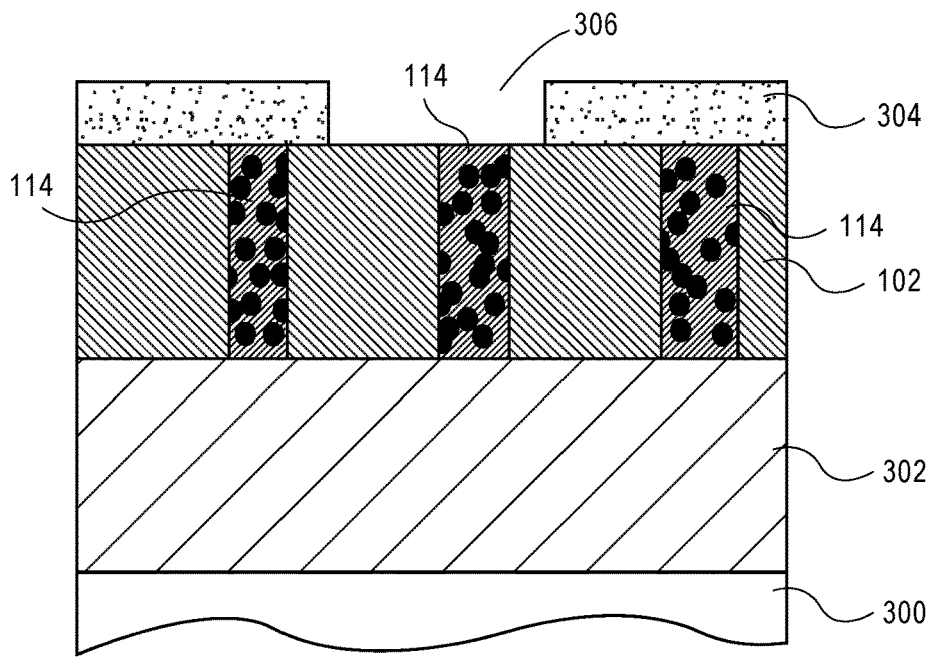
FIGS. 3A-3D illustrate cross-sectional views representing various operations in a method of using a pore-filled dielectric material for semiconductor structure manufacture, in accordance with an embodiment of the present invention.

Referring to FIG. 3A, the structure of FIG. 1D is shown having a patterned resist or hardmask layer 304 formed thereon. In an embodiment, the patterned material layer 102 is a patterned hardmask layer. Additionally, an inter-layer dielectric layer 302 is depicted above a substrate 300, below the patterned material layer 102 having the pore-filled dielectric material 114 formed in trenches therein. In an embodiment, the plurality of trenches represents all possible via locations for a metallization layer.

In an embodiment, an opening 306 is formed in patterned resist or hardmask layer 304. In an embodiment, a lithographic exposure is performed to form opening 306 using a relatively large exposure window. For example, in one embodiment, a trench in the center of the exposure window is selected as a via location for ultimate pore-filled dielectric material 114 clearance. Neighboring hardmask material (portions of 102) are exposed but are not impacted by a subsequent etch process because of the dual etch selectivity of the layer 102 and the pore-filled dielectric material 114. As such, even though the neighboring regions are exposed adjacent to one or both sides of the selected trench for via formation, these regions are not impacted by a process used to remove the pore-filled dielectric material 114 from the selected via location or locations.

Figure 3B:
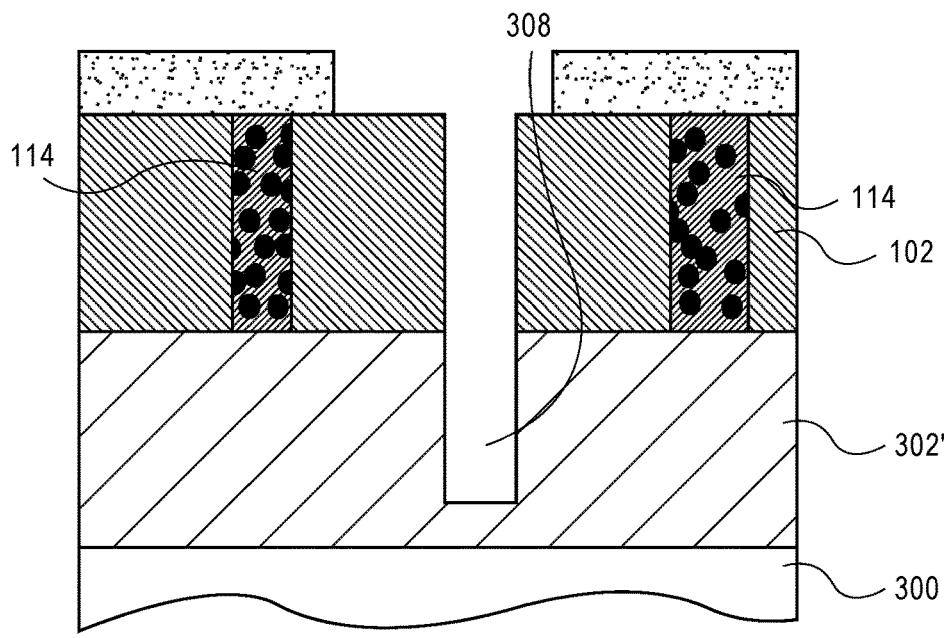

Referring to FIG. 3B, the exposed one of the pore-filled dielectric material regions 114 is removed. In one embodiment, the removal represents removal of the pore-filled dielectric material 114 from fewer than all of the plurality of trenches to define selected via locations for the metallization layer. The patterned hardmask layer 102 and remaining portions of the pore-filled dielectric material 114 are used as a mask to form one or more via trenches 308 in the ILD layer 302 to form once-patterned ILD layer 302'. In one embodiment, the trench 308 represents an eventual interconnect line location having an associated underlying via. Accordingly, the etch process used to form trench 308 is, in one embodiment, a via selection process based on selection and removal of a pore-filled dielectric material 114.

Figure 3C:
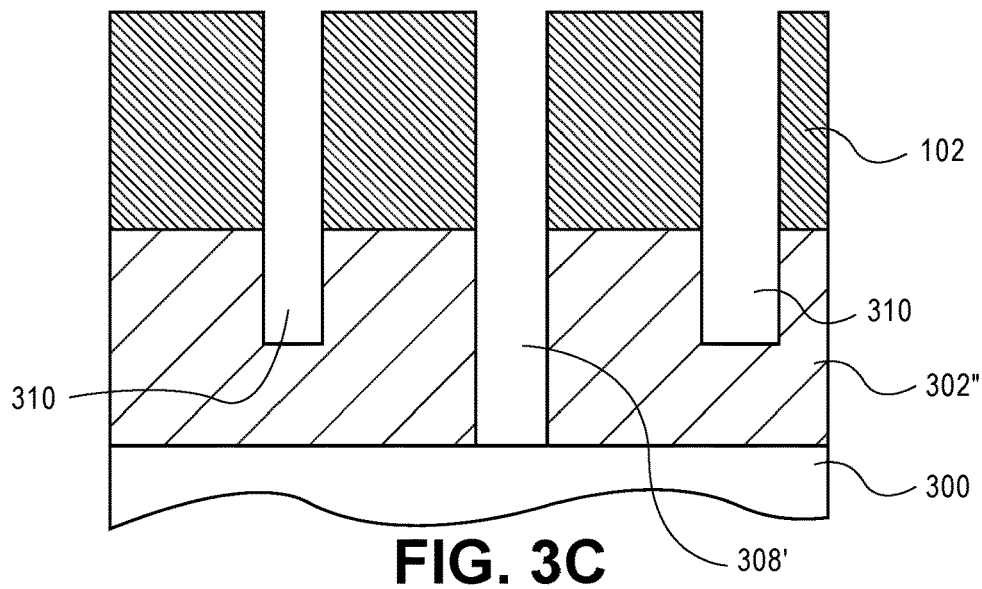

Referring to FIG. 3C, the remaining portions of the pore-filled dielectric material 114 are removed. The patterned hardmask layer 102 is then used as a mask to form line trenches 310 in the ILD layer 302' and to extend the one or more via trenches 308 to form corresponding one or more extended via trenches 308' in a twice-patterned ILD layer 302". In an embodiment, a dry etch process is used to pattern twice-patterned dielectric layer 302".

Figure 3D:
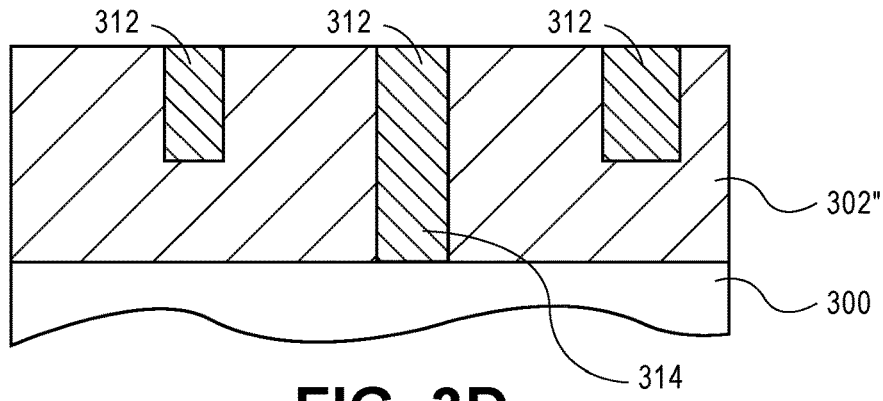

Referring to FIG. 3D, the patterned hardmask layer 102 is removed. The one or more extended via trenches 308' and the line trenches 310 are then filled with a conductive material to form a plurality of metal lines 312 and one or more underlying conductive vias 314. In an embodiment, the plurality of metal lines 312 and one or more underlying conductive vias 314 are formed by a metal deposition and subsequent planarization process.

It is to be appreciated that the resulting structure of FIG. 3D may subsequently be used as a foundation for forming subsequent metal line/via and ILD layers. Alternatively, the structure of FIG. 3D may represent the final metal interconnect layer in an integrated circuit.

Figures 4A, 4B:
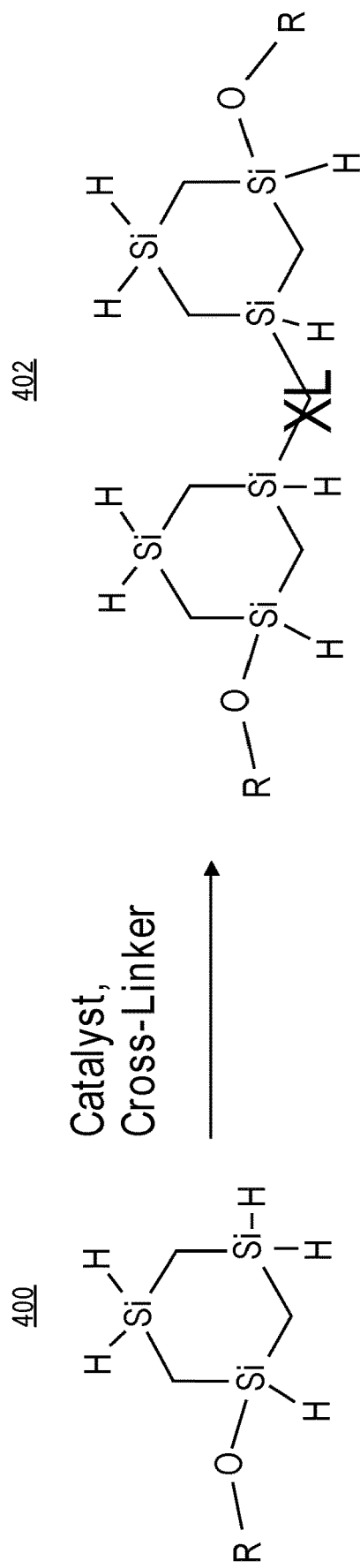
FIG. 4A illustrates a trisilacyclohexane molecule, in accordance with an embodiment of the present invention.
FIG. 4B illustrates two cross-linked (XL) trisilacyclohexane molecules to form a cross-linked material, in accordance with an embodiment of the present invention.
Figure 5:
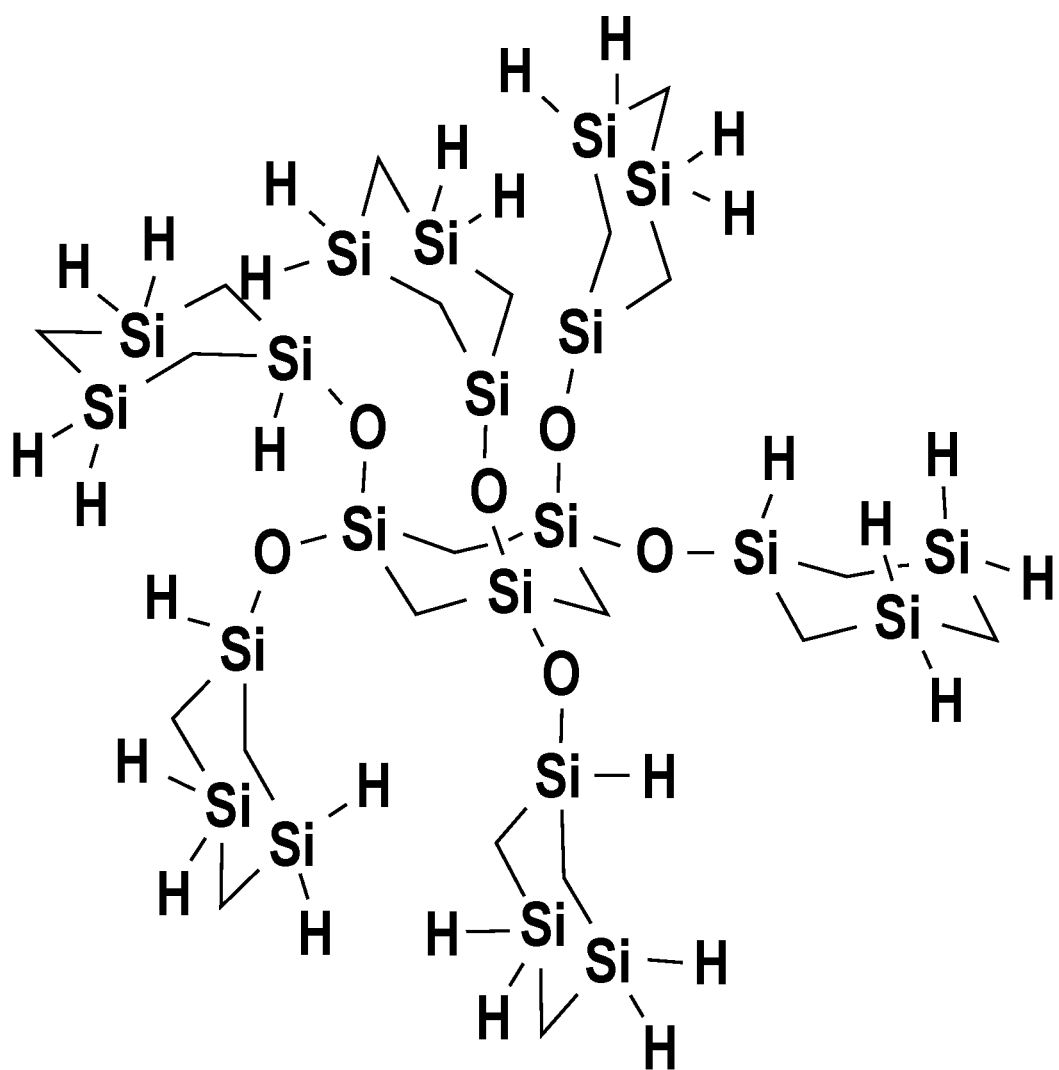
FIG. 5 illustrates an idealized representation of a linked trisilacyclohexane structure, in accordance with an embodiment of the present invention.

As described briefly above, the porous dielectric layer portion of a pore-filled material as described herein is formed by linking trisilacyclohexanes together by O groups. FIG. 4A illustrates an exemplary trisilacyclohexane 400, in accordance with an embodiment of the present invention. Referring to FIG. 4, two cross-linked (XL) trisilacyclohexane molecules 400 form a cross-linked material 402, in accordance with an embodiment of the present invention. FIG. 5 illustrates an idealized representation of a linked trisilacyclohexane structure 500, in accordance with an embodiment of the present invention. It is to be appreciated that, in reality, structure 500 is used to represent a complex mix of oligomers, but the common point is the H-capped trisilacyclohexane rings.

It is to be appreciated that a pore-filled dielectric material as described herein may be retained in a final semiconductor structure. In an example, FIGS. 6A-6H illustrate portions of integrated circuit layers representing various operations in a method of using a pore-filled dielectric material for semiconductor structure fabrication, in accordance with another embodiment of the present invention. In each illustration at each described operation, an angled three-dimensional cross-section view is provided.

Figure 6A:
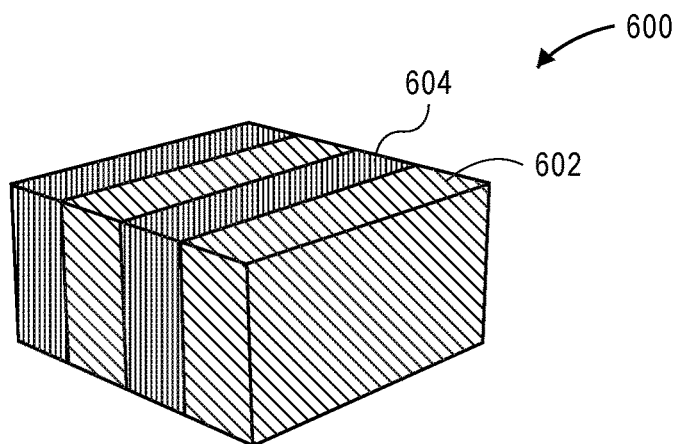
FIGS. 6A-6H illustrate portions of integrated circuit layers representing various operations in a method of using a pore-filled dielectric material for semiconductor structure fabrication, in accordance with another embodiment of the present invention.

FIG. 6A illustrates a starting point structure 600 for a subtractive via and plug process following deep metal line fabrication, in accordance with an embodiment of the present invention. Referring to FIG. 6A, structure 600 includes metal lines 602 with intervening interlayer dielectric (ILD) lines 604. It is to be appreciated that some of the lines 602 may be associated with underlying vias for coupling to a previous interconnect layer. In an embodiment, the metal lines 602 are formed by patterning trenches into an ILD material (e.g., the ILD material of lines 604). The trenches are then filled by metal and, if needed, planarized to the top of the ILD lines 604. In an embodiment, the metal trench and fill process involves high aspect ratio features. For example, in one embodiment, the aspect ratio of metal line height to metal line width is approximately in the range of 5-10.

Figure 6B:
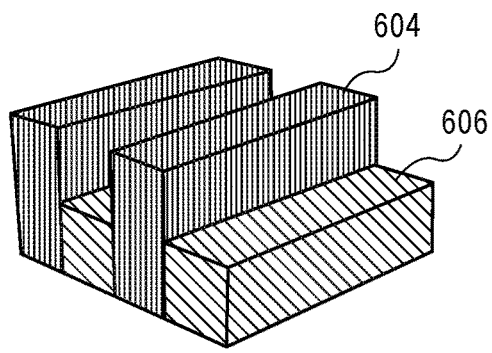

FIG. 6B illustrates the structure of FIG. 6A following recessing of the metal lines, in accordance with an embodiment of the present invention. Referring to FIG. 6B, the metal lines 602 are recessed selectively to provide first level metal lines 606. The recessing is performed selectively to the ILD lines 604. The recessing may be performed by etching through dry etch, wet etch, or a combination thereof. The extent of recessing may be determined by the targeted thickness of the first level metal lines 606 for use as suitable conductive interconnect lines within a back end of line (BEOL) interconnect structure.

Figure 6C:
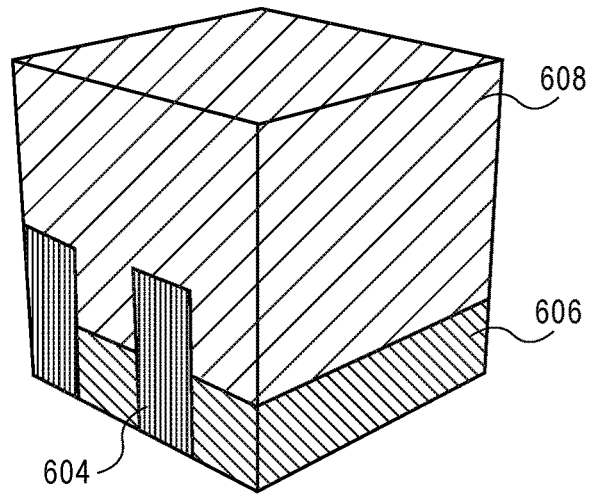

FIG. 6C illustrates the structure of FIG. 6B following formation of an interlayer dielectric (ILD) layer, in accordance with an embodiment of the present invention. Referring to FIG. 6C, an ILD material layer 608 is deposited and, if necessary, planarized, to a level above the recessed metal lines 606 and the ILD lines 604.

Figure 6D:
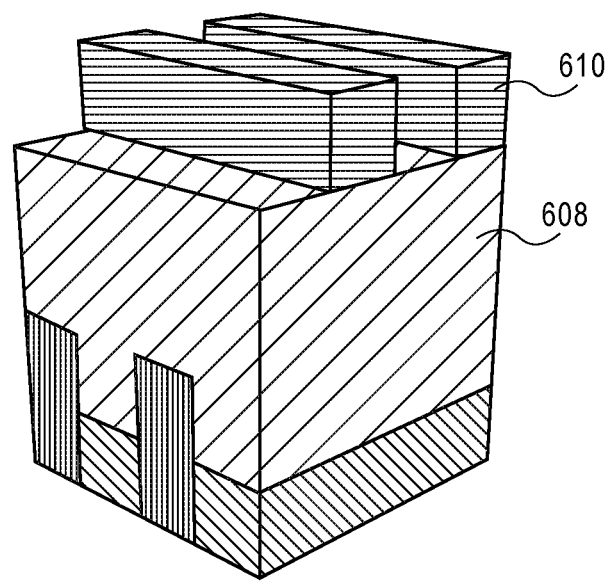

FIG. 6D illustrates the structure of FIG. 6C following deposition and patterning of a hardmask layer, in accordance with an embodiment of the present invention. Referring to FIG. 6D a hardmask layer 610 is formed on the ILD layer 608. In one such embodiment, the hardmask layer 610 is formed with a grating pattern orthogonal to the grating pattern of the first level metal lines 606/ILD lines 604, as is depicted in FIG. 6D. In an embodiment, the grating structure formed by the hardmask layer 610 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the second hardmask layer 610 of FIG. 6D may have hardmask lines spaced at a constant pitch and having a constant width.

Figure 6E:
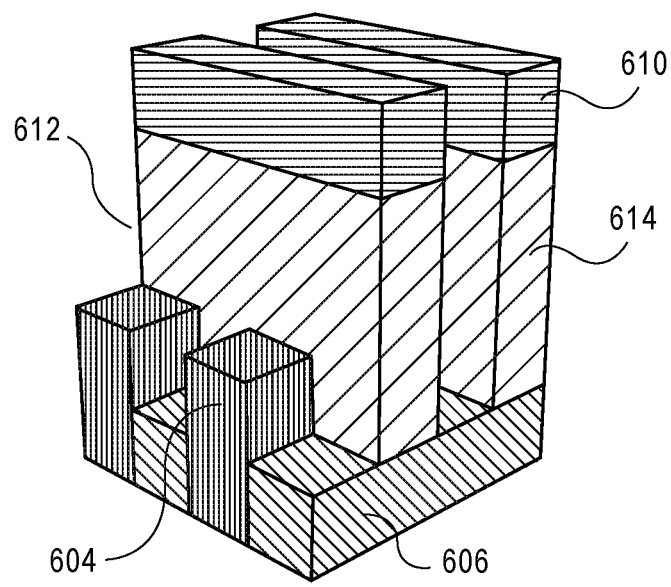

FIG. 6E illustrates the structure of FIG. 6D following trench formation defined using the pattern of the hardmask of FIG. 6D, in accordance with an embodiment of the present invention. Referring to FIG. 6E, the exposed regions (i.e., unprotected by 610) of the ILD layer 608 are etched to form trenches 612 and patterned ILD layer 614. The etch stops on, and thus exposes, the top surfaces of the first level metal lines 606 and the ILD lines 604.

Figure 6F:
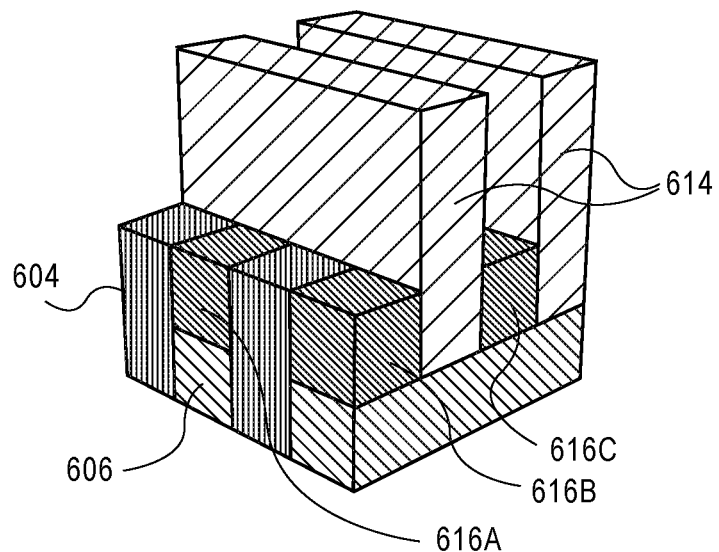

FIG. 6F illustrates the structure of FIG. 6E following a pore-filled dielectric material formation, in accordance with an embodiment of the present invention. Referring to FIG. 6F, a pore-filled dielectric material 616A, 616B and 616C is formed in possible via locations above exposed portions of the recessed metal lines 606. The pore-filled dielectric material 616A, 616B and 616C is formed laterally adjacent to the ILD lines 604. Additionally, referring again to FIG. 6F, the hardmask layer 610 may be removed from the patterned ILD layer 614.

Figure 6G:
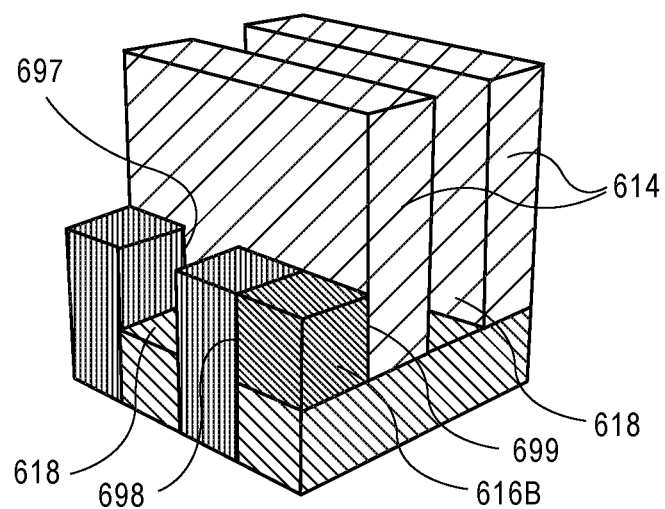

FIG. 6G illustrates the structure of FIG. 6F following removal of portions of the pore-filled dielectric material to reveal selected via locations. For example, portions 616A and 616C of the pore-filled dielectric material are removed in select via locations. On the other hand, remaining pore-filled dielectric material 616B is retained in locations not selected for via formation. In an embodiment, the etch characteristics of the portions 616A and 616C of the pore-filled dielectric material enable highly selective removal of the portions 616A and 616C of the pore-filled dielectric material relative to the ILD lines 604 and the ILD lines 614. In one such embodiment, the difference in etch characteristics between the portions 616A and 616C of the pore-filled dielectric material relative to the ILD lines 604 and the ILD lines 614 enables use of a wider or more relaxed lithographic process, allowing for some overlap and exposure of portions of the ILD lines 604 and/or the ILD lines 614.

Referring again to FIG. 6G, in an embodiment, the resulting structure includes up to three different dielectric material regions (ILD lines 604+ILD lines 614+remaining pore-filled dielectric material 616B) in a single plane of the metallization structure. In one such embodiment, the ILD lines 604 and ILD lines 614 are composed of a same material. In another such embodiment, the ILD lines 604, and the ILD lines 614 are composed of different ILD materials. In either case, the remaining pore-filled dielectric material 616B is composed of a porous dielectric material having filled pores, examples of which are described above, and is different from the material of the ILD lines 604 and the ILD lines 614. In a specific embodiment, a distinction such as a vertical seam between the materials of ILD lines 604 and ILD lines 614 (e.g., seam 697) and/or between ILD lines 604 and the remaining pore-filled dielectric material 616B (e.g., seam 698) and/or between ILD lines 614 and the remaining pore-filled dielectric material 616B (e.g., seam 699) is observed in the final structure.

Figure 6H:
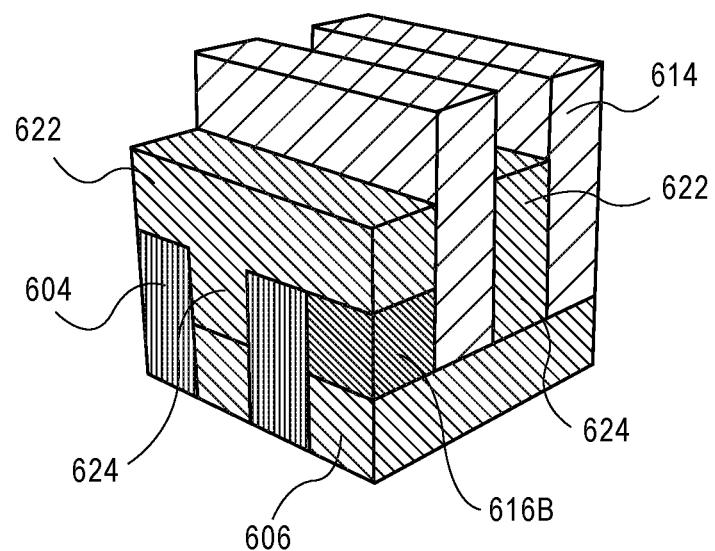

FIG. 6H illustrates the structure of FIG. 6G following metal line and via formation, in accordance with an embodiment of the present invention. Referring to FIG. 6H, metal lines 622 and vias 624 are formed upon metal fill of the openings of FIG. 6G. The metal lines 622 are coupled to the underlying metal lines 606 by the vias 624. In an embodiment, the openings are filled in a damascene approach or a bottom-up fill approach to provide the structure shown in FIG. 6H. Thus, the metal (e.g., copper and associated barrier and seed layers) deposition to form metal lines and vias in the above approach may be that typically used for standard back end of line (BEOL) processing. In an embodiment, in subsequent fabrication operations, the ILD lines 614 may be removed to provide air gaps between the resulting metal lines 624. In an embodiment, the remaining pore-filled dielectric material 616B is retained in the final structure of FIG. 6H, as is depicted in FIG. 6H.

The structure of FIG. 6H may subsequently be used as a foundation for forming subsequent metal line/via and ILD layers. Alternatively, the structure of FIG. 6H may represent the final metal interconnect layer in an integrated circuit. It is to be appreciated that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. Furthermore, the ILD used to select which plugs and vias will likely be very different from the primary ILD and will be perfectly self-aligned in both directions. As such, in an embodiment, offset due to conventional lithography/dual damascene patterning that must otherwise be tolerated, is not a factor for the resulting structures described herein. Referring again to FIG. 6H, then, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

In an embodiment, the term "grating structure" for metal lines, ILD lines or hardmask lines is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a constant pitch and having a constant width. The pattern may be fabricated by a pitch halving or pitch quartering, or other pitch division, approach.

Figure 7A:
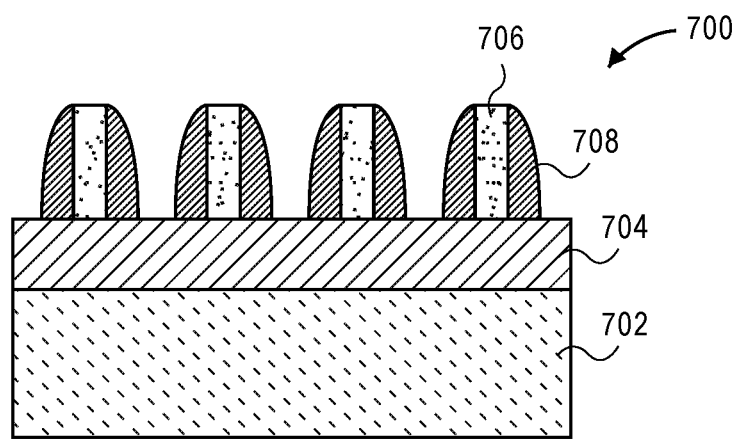
FIG. 7A illustrates a cross-sectional view of a starting structure following deposition, but prior to patterning, of a hardmask material layer formed on an interlayer dielectric (ILD) layer, in accordance with another embodiment of the present invention.
Figure 7B:
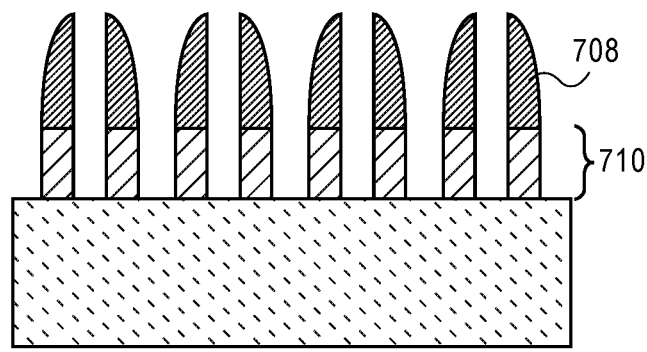
FIG. 7B illustrates a cross-sectional view of the structure of FIG. 7A following patterning of the hardmask layer by pitch halving.

In an example, pitch halving can be implemented to double the line density of a fabricated grating structure. FIG. 7A illustrates a cross-sectional view of a starting structure following deposition, but prior to patterning, of a hardmask material layer formed on an interlayer dielectric (ILD) layer. FIG. 7B illustrates a cross-sectional view of the structure of FIG. 7A following patterning of the hardmask layer by pitch halving.

Referring to FIG. 7A, a starting structure 700 has a hardmask material layer 704 formed on an interlayer dielectric (ILD) layer 702. A patterned mask 706 is disposed above the hardmask material layer 704. The patterned mask 706 has spacers 708 formed along sidewalls of features (lines) thereof, on the hardmask material layer 704.

Referring to FIG. 7B, the hardmask material layer 704 is patterned in a pitch halving approach. Specifically, the patterned mask 706 is first removed. The resulting pattern of the spacers 708 has double the density, or half the pitch or the features of the mask 706. The pattern of the spacers 708 is transferred, e.g., by an etch process, to the hardmask material layer 704 to form a patterned hardmask 710, as is depicted in FIG. 7B. In one such embodiment, the patterned hardmask 710 is formed with a grating pattern having unidirectional lines. The grating pattern of the patterned hardmask 710 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 710 of FIG. 7B may have hardmask lines spaced at a constant pitch and having a constant width relative to one another. The dimensions achieved may be far smaller than the critical dimension of the lithographic technique employed.

Accordingly, for either FEOL or BEOL, or both, integrations schemes, a blanket film may be patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented.

Figure 8:
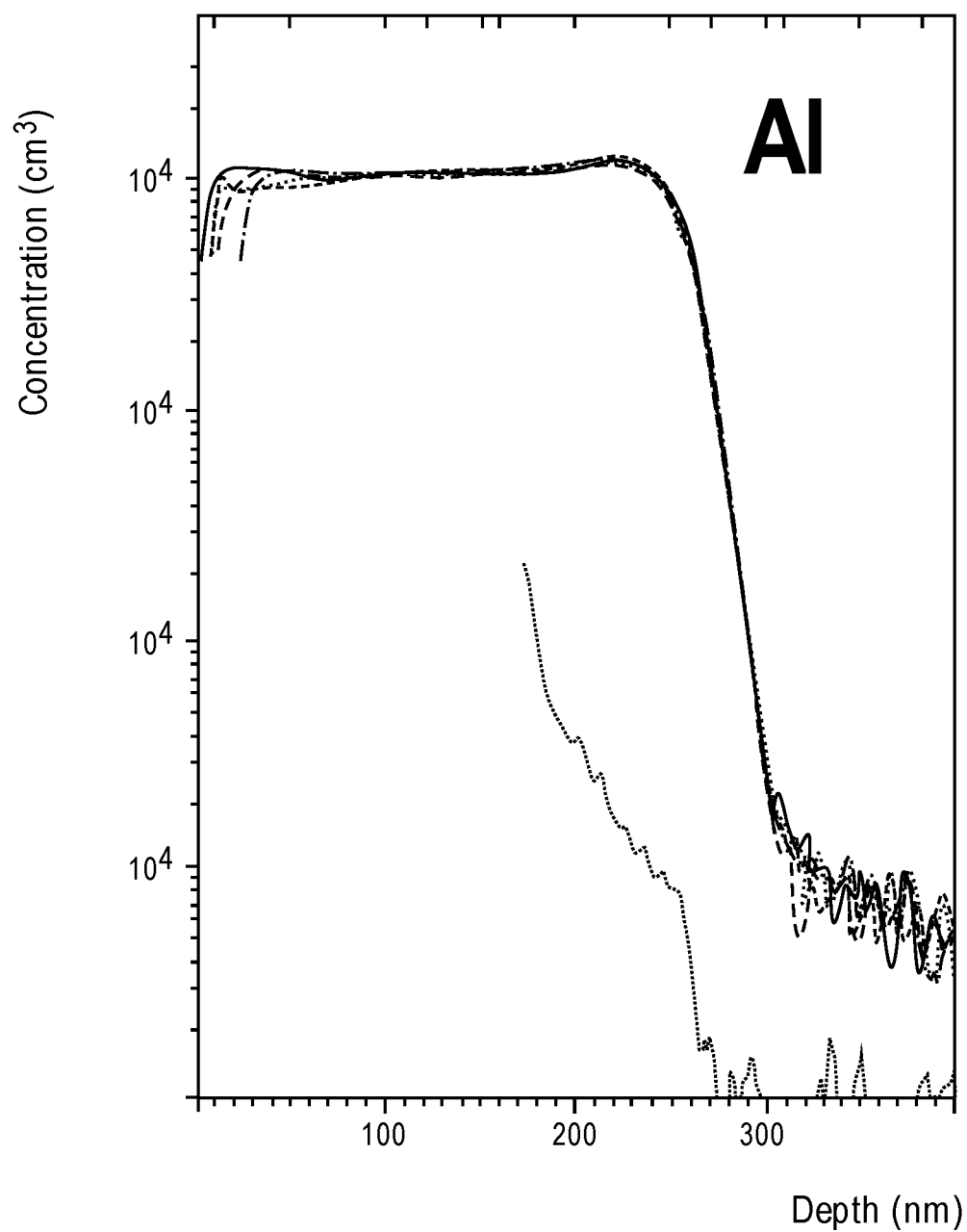
FIG. 8 is a plot of aluminum (Al) concentration (in $cm^3$) as a function of depth (in nanometers, nm) for an aluminum based chemistry deposited in pores of a porous dielectric layer, in accordance with an embodiment of the present invention.
Figure 9:
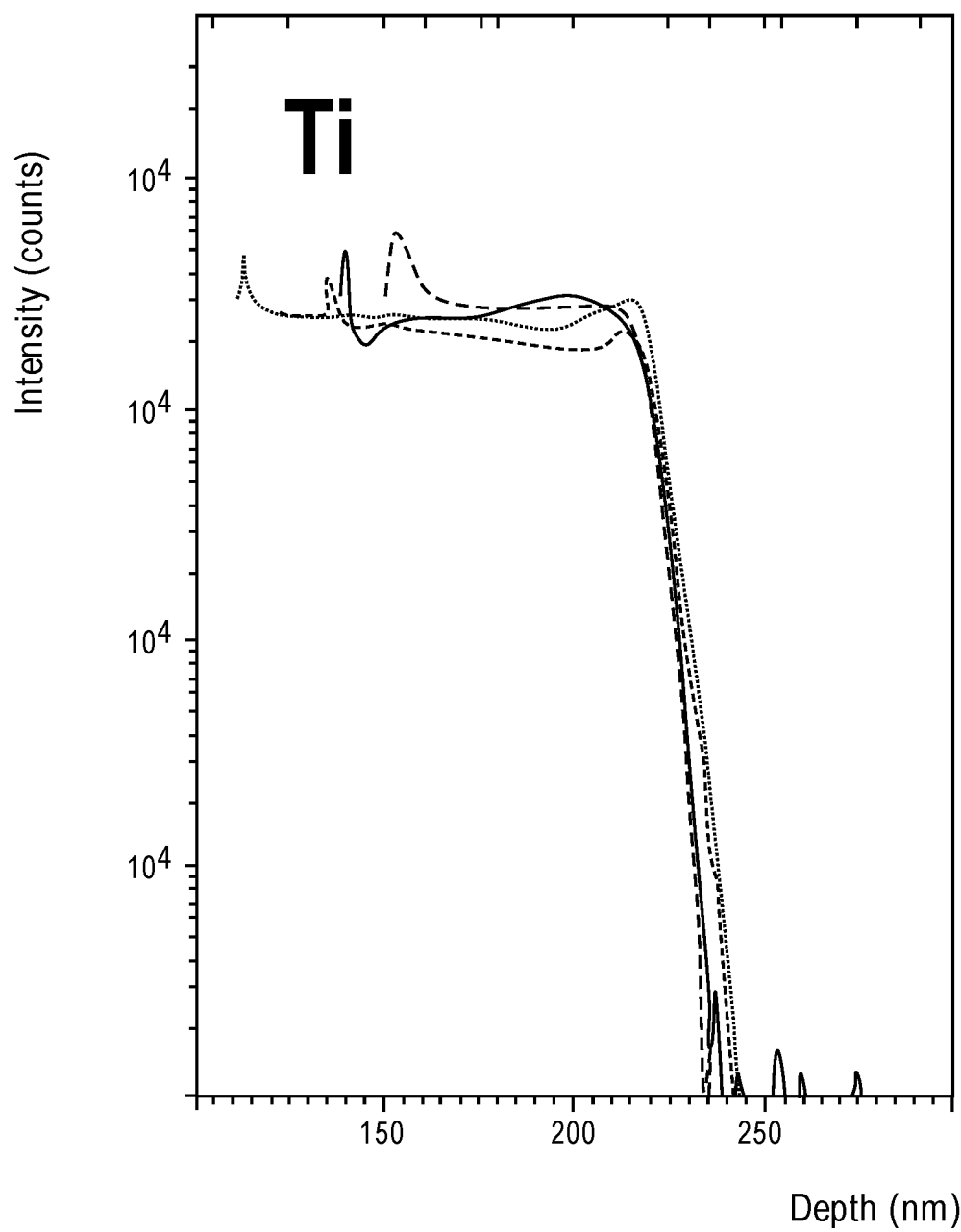
FIG. 9 is a plot of titanium (Ti) intensity (in relative counts) as a function of depth (in nanometers, nm) for a titanium based chemistry deposited in pores of a porous dielectric layer, in accordance with an embodiment of the present invention.

As described above, in an embodiment, a slow and penetrating atomic layer deposition (ALD) process is used to fill the pores of aporous dielectric material. To demonstrate the effect, time of flight secondary ion mass spectroscopy (TOF SIMS) data may be used to confirm uniform fill from top to bottom. In a first example, FIG. 8 is a plot of aluminum (Al) concentration (in $cm^3$) as a function of depth (in nanometers, nm) for an aluminum based chemistry deposited in pores of a porous dielectric layer, in accordance with an embodiment of the present invention. The lowest curve represents an unfilled porous dielectric sample. In a second example, FIG. 9 is a plot of titanium (Ti) intensity (in relative counts) as a function of depth (in nanometers, nm) for a titanium based chemistry deposited in pores of a porous dielectric layer, in accordance with an embodiment of the present invention.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers may be formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

It is to be appreciated that the layers and materials described above are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted above may be fabricated on underlying lower level back end of line (BEOL) interconnect layers.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc.

The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
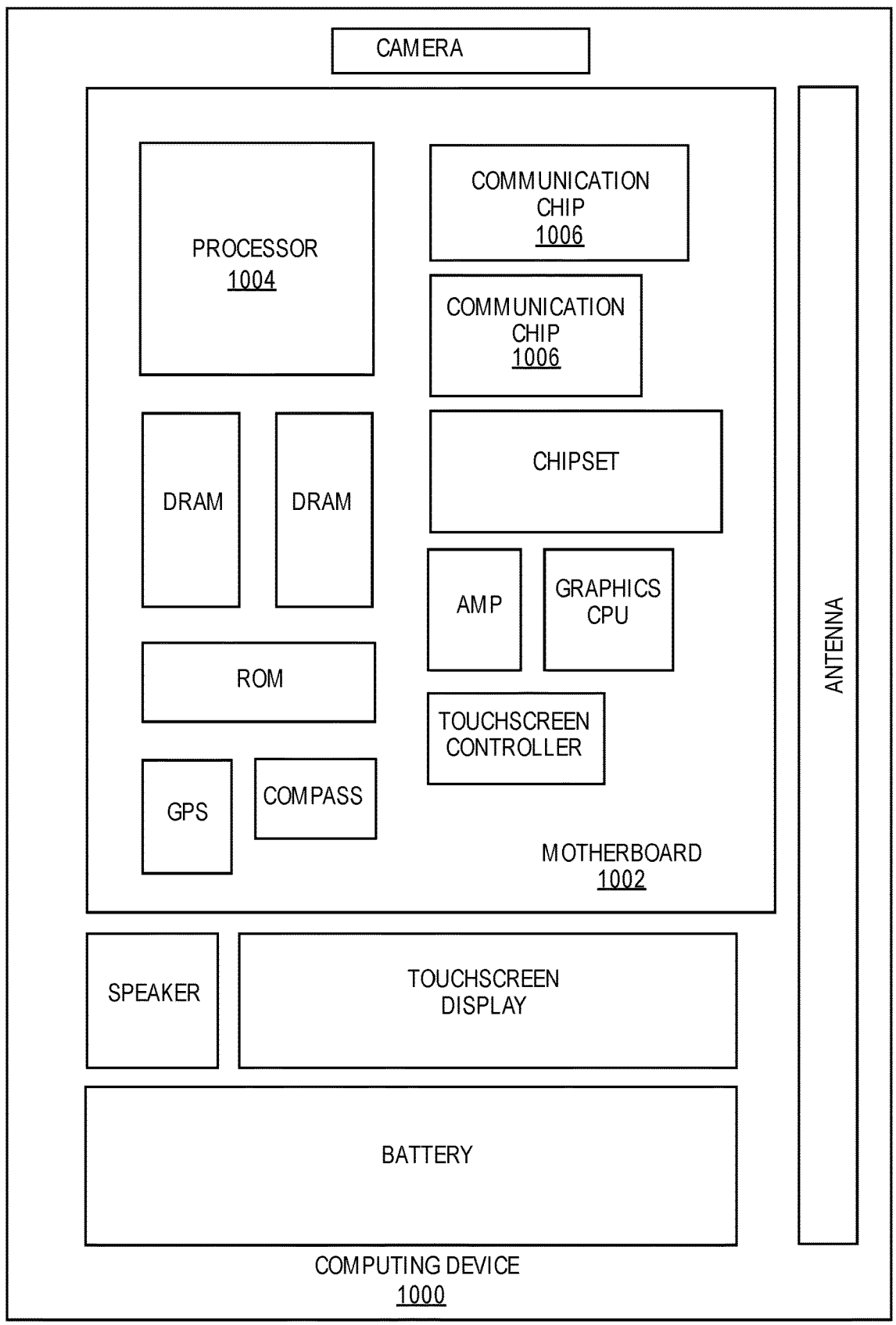
FIG. 10 illustrates a computing device in accordance with one implementation of an embodiment of the invention.

FIG. 10 illustrates a computing device 1000 in accordance with one implementation of an embodiment of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In an embodiment, the integrated circuit die of the processor includes or is fabricated using a pore-filled dielectric material as described herein. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In an embodiment, the integrated circuit die of the communication chip includes or is fabricated using a pore-filled dielectric material as described herein.

In further implementations, another component housed within the computing device 1000 may contain an integrated circuit die that includes or is fabricated using a pore-filled dielectric material as described herein.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
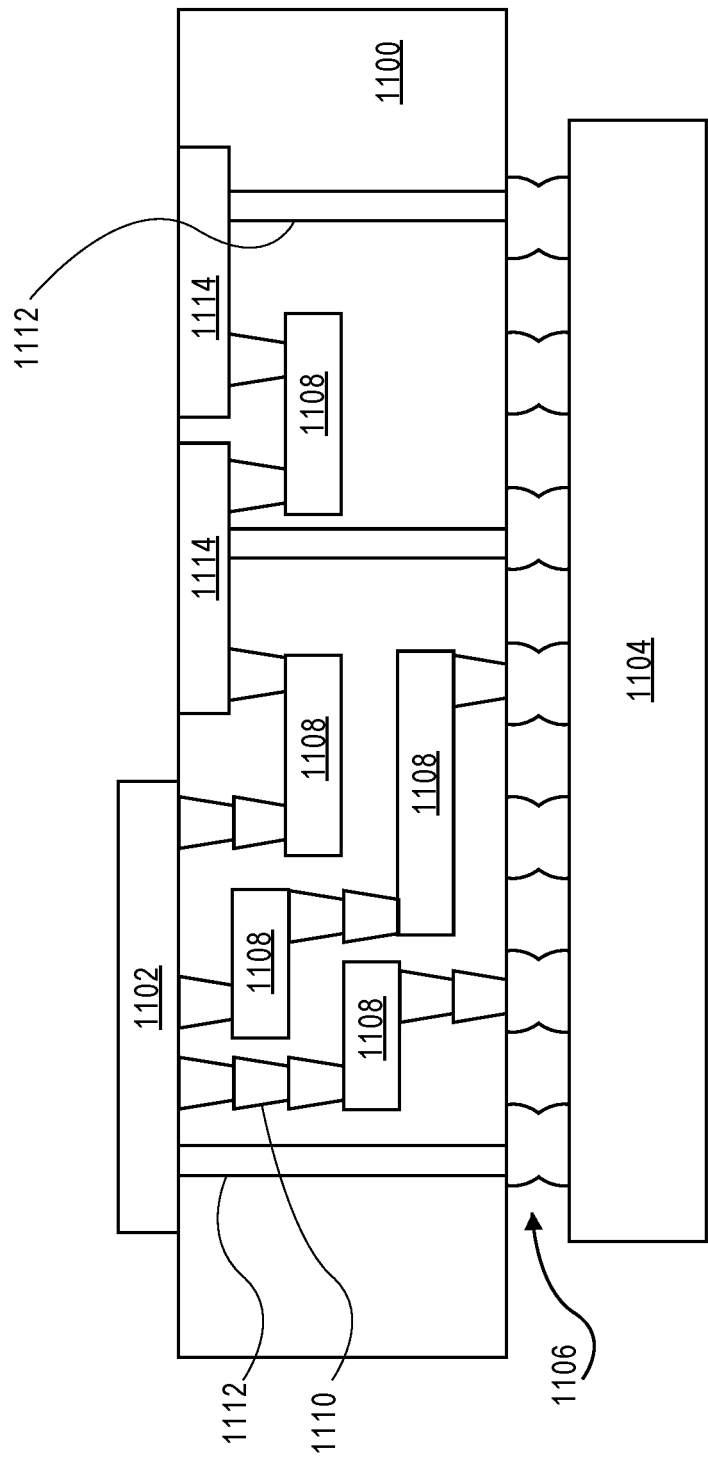
FIG. 11 is an interposer implementing one or more embodiments of the invention.

FIG. 11 illustrates an interposer 1100 that includes one or more embodiments of the invention. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the invention, apparatuses or processes disclosed herein may be used in the fabrication of interposer 1100.

Thus, embodiments of the present invention include pore-filled dielectric materials for semiconductor structure fabrication, and methods of fabricating pore-filled dielectric materials for semiconductor structure fabrication.

Example Embodiment 1

A method of fabricating a pore-filled dielectric material for semiconductor structure fabrication includes forming a trench in a material layer above a substrate. The method also includes filling the trench with a porous dielectric material using a spin-on deposition process. The method also includes filling pores of the porous dielectric material with a metal-containing material using an atomic layer deposition (ALD) process.

Example Embodiment 2

The method of example embodiment 1, wherein filling the trench with the porous dielectric material includes filling the trench with a material selected from the group consisting of a material based on trisilacyclohexanes linked together by O groups, a material formed from alkoxy-silane based dielectric precursors, and a silsesquioxane (SSQ) material.

Example Embodiment 3

The method of example embodiment 1 or 2, wherein filling the trench with the porous dielectric material includes filling the trench with a material having a porosity of 30% or more.

Example Embodiment 4

The method of example embodiment 1, 2 or 3, wherein filling the pores of the porous dielectric material with the metal-containing material includes filling the pores with a metal nitride material or a metal oxide material.

Example Embodiment 5

The method of example embodiment 1, 2, 3 or 4, wherein filling the pores of the porous dielectric material with the metal-containing material includes forming a pore-filled dielectric material having an etch rate dominated by the metal-containing material when exposed to an etchant including a fluorocarbon.

Example Embodiment 6

The method of example embodiment 1, 2, 3, 4 or 5, wherein filling the pores of the porous dielectric material with the metal-containing material provides a hardmask layer having a dual etch selectivity.

Example Embodiment 7

A method of fabricating a metallization layer for a semiconductor structure includes forming a plurality of trenches in a hardmask layer above an inter-layer dielectric (ILD) layer above a substrate to form a patterned hardmask layer. The plurality of trenches represents all possible via locations for the metallization layer. The method also includes filling the plurality of trenches with a porous dielectric material. The method also includes filling pores of the porous dielectric material with a metal-containing material to form a pore-filled dielectric material. The method also includes removing the pore-filled dielectric material from fewer than all of the plurality of trenches to define selected via locations for the metallization layer.

Example Embodiment 8

The method of example embodiment 7, wherein filling the plurality of trenches with the porous dielectric material includes using a spin-on deposition process.

Example Embodiment 9

The method of example embodiment 7 or 8, wherein filling the pores of the porous dielectric material with the metal-containing material includes using an atomic layer deposition (ALD) process.

Example Embodiment 10

The method of example embodiment 7, 8 or 9, wherein filling the plurality of trenches with the porous dielectric material includes filling the plurality of trenches with a material a material having a porosity of 30% or more, the material selected from the group consisting of a material based on trisilacyclohexanes linked together by O groups, a material formed from alkoxy-silane based dielectric precursors, and a silsesquioxane (SSQ) material.

Example Embodiment 11

The method of example embodiment 7, 8, 9 or 10, wherein filling the pores of the porous dielectric material with the metal-containing material includes filling the pores with a metal nitride material or a metal oxide material.

Example Embodiment 12

The method of example embodiment 7, 8, 9, 10 or 11, further including using the patterned hardmask layer and remaining portions of the pore-filled dielectric material as a mask to form one or more via trenches in the ILD layer.

Example Embodiment 13

The method of example embodiment 12, further including removing the remaining portions of the pore-filled dielectric material, using the patterned hardmask layer as a mask to form line trenches in the ILD layer and to extend the one or more via trenches to form corresponding one or more extended via trenches, removing the patterned hardmask layer, and filling the one or more extended via trenches and the line trenches with a conductive material to form a plurality of metal lines one or more underlying conductive vias.

Example Embodiment 14

A method of patterning a layer for a semiconductor structure includes forming a plurality of trenches in a dielectric layer above a semiconductor layer above a substrate to form a patterned dielectric layer. The method also includes filling the plurality of trenches with a porous dielectric material. The method also includes filling pores of the porous dielectric material with a metal-containing material to form a pore-filled dielectric material. The method also includes removing the patterned dielectric layer selective to the pore-filled dielectric material. The method also includes using the pore-filled dielectric material to pattern the semiconductor layer.

Example Embodiment 15

The method of example embodiment 14, wherein filling the plurality of trenches with the porous dielectric material includes using a spin-on deposition process.

Example Embodiment 16

The method of example embodiment 14 or 15, wherein filling the pores of the porous dielectric material with the metal-containing material includes using an atomic layer deposition (ALD) process.

Example Embodiment 17

The method of example embodiment 14, 15 or 16, wherein filling the plurality of trenches with the porous dielectric material includes filling the plurality of trenches with a material a material having a porosity of 30% or more, the material selected from the group consisting of a material based on trisilacyclohexanes linked together by O groups, a material formed from alkoxy-silane based dielectric precursors, and a silsesquioxane (SSQ) material.

Example Embodiment 18

The method of example embodiment 14, 15, 16 or 17, wherein filling the pores of the porous dielectric material with the metal-containing material includes filling the pores with a metal nitride material or a metal oxide material.

Example Embodiment 19

The method of example embodiment 14, 15, 16, 17 or 18, wherein forming the plurality of trenches in the dielectric layer includes forming the plurality of trenches in a carbon-doped silicon oxide material.

Example Embodiment 20

The method of example embodiment 14, 15, 16, 17, 18 or 19, wherein using the pore-filled dielectric material to pattern the semiconductor layer includes forming a plurality of semiconductor fins in the semiconductor layer.

Example Embodiment 21

An interconnect structure for an integrated circuit includes a first layer of the interconnect structure disposed above a substrate. The first layer includes a first grating of alternating metal lines and dielectric lines in a first direction. The dielectric lines have an uppermost surface higher than an uppermost surface of the metal lines. A second layer of the interconnect structure is disposed above the first layer of the interconnect structure. The second layer includes a second grating of alternating metal lines and dielectric lines in a second direction, perpendicular to the first direction. The dielectric lines have a lowermost surface lower than a lowermost surface of the metal lines of the second grating. The dielectric lines of the second grating overlap and contact, but are distinct from, the dielectric lines of the first grating. A region of dielectric material is disposed between the metal lines of the first grating and the metal lines of the second grating, and in a same plane as upper portions of the dielectric lines of the first grating and lower portions of the dielectric lines of the second grating. The region of dielectric material includes a porous dielectric material filled with a metal-containing material.

Example Embodiment 22

The interconnect structure of example embodiment 21, further including a conductive via disposed between and coupling a metal line of the first grating to a metal line of the second grating, the conductive via in the same plane as the region of dielectric material.

Example Embodiment 23

The interconnect structure of example embodiment 21 or 22, wherein the dielectric lines of the first grating are composed of a first dielectric material, and the dielectric lines of the second grating are composed of a second, different dielectric material. The first and second dielectric materials are different than the region of dielectric material composed of the porous dielectric material filled with the metal-containing material.

Example Embodiment 24

The interconnect structure of example embodiment 21, 22 or 23, wherein the porous dielectric material of the region of dielectric material has a porosity of 30% or more, and is selected from the group consisting of a material based on trisilacyclohexanes linked together by O groups, a material formed from alkoxy-silane based dielectric precursors, and a silsesquioxane (SSQ) material.

Example Embodiment 25

The interconnect structure of example embodiment 21, 22, 23 or 24, wherein the metal-containing material of the region of dielectric material is a metal nitride material or a metal oxide material.

What is claimed is:

1. An interconnect structure for an integrated circuit, the interconnect structure comprising:
   a first layer of the interconnect structure disposed above a substrate, the first layer comprising a first grating of alternating metal lines and dielectric lines in a first direction, wherein the dielectric lines have an uppermost surface higher than an uppermost surface of the metal lines; and
   a second layer of the interconnect structure disposed above the first layer of the interconnect structure, the second layer comprising a second grating of alternating metal lines and dielectric lines in a second direction, perpendicular to the first direction, wherein the dielectric lines have a lowermost surface lower than a lowermost surface of the metal lines of the second grating, wherein the dielectric lines of the second grating overlap and contact, but are distinct from, the dielectric lines of the first grating; and
   a region of dielectric material disposed between the metal lines of the first grating and the metal lines of the second grating, and in a same plane as upper portions of the dielectric lines of the first grating and lower portions of the dielectric lines of the second grating, the region of dielectric material comprising a porous dielectric material filled with a metal-containing material.

2. The interconnect structure of claim 1, further comprising:
   a conductive via disposed between and coupling a metal line of the first grating to a metal line of the second grating, the conductive via in the same plane as the region of dielectric material.

3. The interconnect structure of claim 1, wherein the dielectric lines of the first grating comprise a first dielectric material, and the dielectric lines of the second grating comprise a second, different dielectric material, and wherein the first and second dielectric materials are different than the region of dielectric material comprising the porous dielectric material filled with the metal-containing material.

4. The interconnect structure of claim 1, wherein the porous dielectric material of the region of dielectric material has a porosity of 30% or more, and is selected from the group consisting of a material based on trisilacyclohexanes linked together by O groups, a material formed from alkoxysilane based dielectric precursors, and a silsesquioxane (SSQ) material.

5. The interconnect structure of claim 1, wherein the metal-containing material of the region of dielectric material is a metal nitride material or a metal oxide material.

* * * * *